(12) United States Patent
Hattori et al.

(10) Patent No.: US 7,672,112 B2
(45) Date of Patent: Mar. 2, 2010

(54) COMPONENT-EMBEDDED SUBSTRATE AND COMPONENT PACKAGE USING COMPONENT-EMBEDDED SUBSTRATE

(75) Inventors: Kazuo Hattori, Yasu (JP); Isamu Fujimoto, Yasu (JP); Shinichiro Kuroiwa, Yasu (JP); Satoru Noda, Ohtsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/369,759

(22) Filed: Feb. 12, 2009

(65) Prior Publication Data
US 2009/0201624 A1 Aug. 13, 2009

(30) Foreign Application Priority Data
Feb. 13, 2008 (JP) .............................. 2008-032117

(51) Int. Cl.
*H01G 4/228* (2006.01)
(52) U.S. Cl. .............. 361/306.2; 361/306.1; 361/306.3; 361/303; 361/321.1; 361/321.2
(58) Field of Classification Search .............. 361/306.2, 361/306.1, 306.3, 303–305, 311–313, 321.1, 361/321.2, 301.4
See application file for complete search history.

(56) References Cited

U.S. PATENT DOCUMENTS

| 6,292,351 | B1 | 9/2001 | Ahiko et al. | |
| 6,380,619 | B2 * | 4/2002 | Ahiko et al. | 257/703 |
| 6,515,842 | B1 * | 2/2003 | Hayworth et al. | 361/303 |
| 6,795,295 | B2 * | 9/2004 | Murakami et al. | 361/306.3 |
| 6,807,047 | B2 * | 10/2004 | Togashi et al. | 361/321.2 |
| 6,940,708 | B2 * | 9/2005 | Yoshii et al. | 361/303 |
| 7,230,815 | B2 * | 6/2007 | Yoon et al. | 361/303 |

(Continued)

FOREIGN PATENT DOCUMENTS

EP  1 137 332 A1  9/2001

(Continued)

OTHER PUBLICATIONS

Official Communication issued in corresponding Japanese Patent Application No 2008-032117, mailed on Nov. 10, 2009.

*Primary Examiner*—Nguyen T Ha
(74) *Attorney, Agent, or Firm*—Keating and Bennett, LLP

(57) ABSTRACT

A component-embedded substrate includes a chip capacitor. The chip capacitor includes a ceramic laminate body and a plurality of terminal electrodes. The component-embedded substrate has a first principal surface and a second principal surface. At least two of the plurality of terminal electrodes are connected to the first principal surface and define a first terminal electrode group, and at least two of the plurality of terminal electrodes are connected to the second principal surface and define a second terminal electrode group. One terminal electrode in the first terminal electrode group is electrically connected to one terminal electrode in the second terminal electrode group via the internal electrodes, and capacitance is provided by a pair of the terminal electrodes in the first terminal electrode group via the dielectric layer, and capacitance is provided by a pair of the terminal electrodes in the second terminal electrode group via the dielectric layer. A direction in which the internal electrodes are stacked is parallel or substantially parallel to the two principal surfaces.

8 Claims, 11 Drawing Sheets

U.S. PATENT DOCUMENTS

| | | | |
|---|---|---|---|
| 7,362,560 B2 * | 4/2008 | Tsujimura et al. | 361/306.3 |
| 7,436,648 B2 * | 10/2008 | Togashi | 361/303 |
| 2001/0019176 A1 | 9/2001 | Ahiko et al. | |
| 2004/0257749 A1 * | 12/2004 | Otsuka et al. | 361/306.3 |
| 2006/0139849 A1 | 6/2006 | Yoon et al. | |
| 2007/0067066 A1 | 3/2007 | Niki | |
| 2007/0074901 A1 | 4/2007 | Takizawa | |

FOREIGN PATENT DOCUMENTS

| | | |
|---|---|---|
| JP | 11-288839 A | 10/1999 |
| JP | 2001-155952 A | 6/2001 |
| JP | 2002-100874 A | 4/2002 |
| JP | 2004-140183 A | 5/2004 |
| JP | 2004-172305 A | 6/2004 |
| JP | 2004-228190 A | 8/2004 |
| JP | 2004-296940 A | 10/2004 |
| JP | 2008-211238 A | 9/2008 |
| WO | 20071084658 A1 | 7/2007 |

* cited by examiner

DIMENSIONS OF DIELECTRIC BODY      L=550, W=T=270
DIMENSIONS OF TERMINAL ELECTRODE   W=T=15
DIMENSIONS OF CONNECTION ELECTRODE L=25

COMPONENT-EMBEDDED SUBSTRATE AND COMPONENT PACKAGE USING COMPONENT-EMBEDDED SUBSTRATE

BACKGROUND OF THE INVENTION

1. Field of the Invention

The present invention relates to a component-embedded substrate and, in particular, to a component-embedded substrate including a chip capacitor.

2. Description of the Related Art

Some existing component-embedded substrates including an integrated circuit device mounted thereon include a decoupling capacitor. For example, Japanese Unexamined Patent Application Publication No. 2002-100874 describes a printed circuit board including a substrate that includes a chip capacitor. More specifically, the printed circuit board includes a core substrate and a chip capacitor disposed in a cavity of the core substrate. The chip capacitor disposed in the cavity is connected to a power supply and an IC chip through via holes.

In the printed circuit board described in Japanese Unexamined Patent Application Publication No. 2002-100874, internal electrodes of the capacitor are stacked in a direction perpendicular to the substrate. An electric current flowing from the power supply to the IC chip passes through an external electrode. Accordingly, the electric current flows through a long indirect route. Thus, the loop inductance of the route passing through the capacitor is increased, and therefore, sufficient high-frequency responsiveness to the IC chip may not be provided.

In addition, a high-frequency electric current to be input to the capacitor flows in the external electrode first and, subsequently, flows in the capacitor. Accordingly, the high-frequency electric current is negligibly absorbed by the capacitor. As a result, the high-frequency noise absorption performance of the capacitor is disadvantageously decreased.

SUMMARY OF THE INVENTION

According to preferred embodiments of the present invention, a component-embedded substrate includes a chip capacitor provided therein, a first principal surface, and a second principal surface. The chip capacitor includes a ceramic laminate body and a plurality of terminal electrodes, and the ceramic laminate body includes a dielectric layer and a plurality of internal electrodes stacked along the dielectric layer. The terminal electrodes connect the internal electrodes to one another. At least two of the plurality of terminal electrodes are connected to the first principal surface and define a first terminal electrode group, and at least two of the plurality of terminal electrodes are connected to the second principal surface and define a second terminal electrode group. At least one terminal electrode in the first terminal electrode group is electrically connected to at least one terminal electrode in the second terminal electrode group via at least one of the internal electrodes. Capacitance is provided by at least one pair of the terminal electrodes in the first terminal electrode group via the dielectric layer, and capacitance is provided by at least one pair of the terminal electrodes in the second terminal electrode group via the dielectric layer. A direction in which the internal electrodes are stacked is parallel or substantially parallel to the two principal surfaces of the component-embedded substrate.

The at least one terminal electrode in the first terminal electrode group that is electrically connected to the at least one terminal electrode in the second terminal electrode group via the internal electrode can preferably be additionally connected via a connection electrode provided on an outer surface of the ceramic laminate body.

Directions of electric currents each flowing from one terminal electrode to the closest adjacent terminal electrode in the first terminal electrode group can preferably be reversed.

A plurality of the chip capacitors can preferably be provided, and one of the first terminal electrode group and the second terminal electrode group can be arranged across the plurality of the chip capacitors.

The terminal electrode of the chip capacitor can preferably be electrically connected to a conductor land provided on one of the first principal surface and the second principal surface via a conductive adhesive agent or solder, for example, and the conductor land can preferably be exposed on a surface of the component-embedded substrate.

The terminal electrode of the chip capacitor can preferably have a surface made of copper, for example.

The conductor land can preferably be made of copper, for example.

According to another preferred embodiment of the present invention, a component package is provided. The component package includes the above-described component-embedded substrate, an active component electrically connected to one of the two principal surfaces of the component-embedded substrate, and a power supply electrically connected to the other principal surface of the component-embedded substrate.

The above-described configurations of a component-embedded substrate decrease the loop inductance of a route from a power supply to an IC via a chip capacitor. Accordingly, high-frequency responsiveness and high-frequency noise absorption performance can be improved. In addition, by using a component package including the component-embedded substrate, a circuit element having outstanding high-frequency responsiveness and outstanding high-frequency noise absorption performance can be provided.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

A first preferred embodiment of the present invention is described in detail below with reference to the accompanying drawings.

Figure 1:
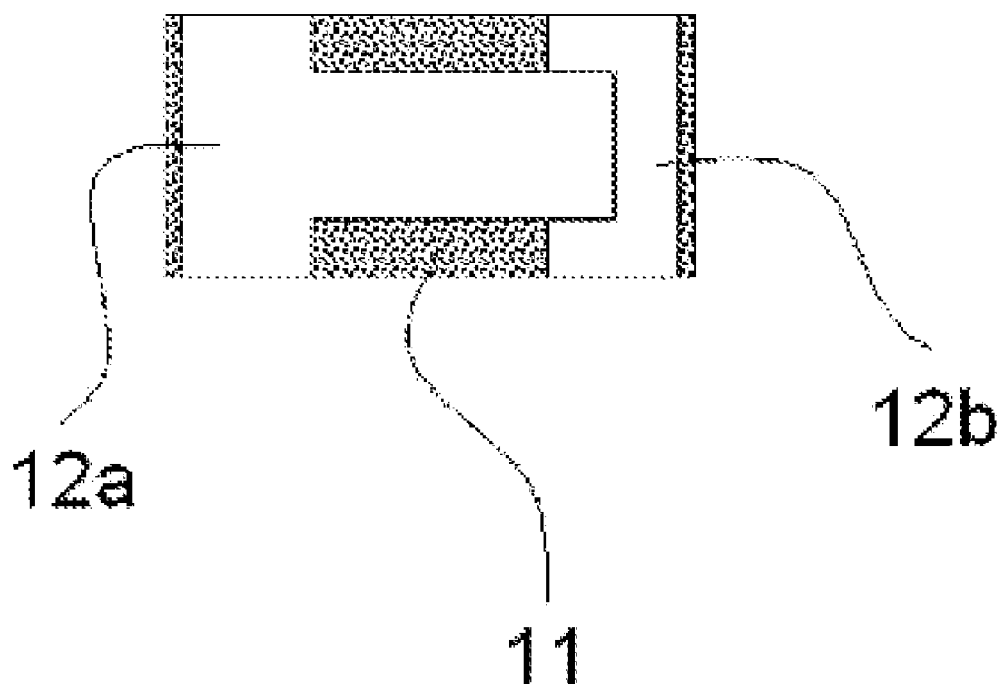
FIG. 1 is a cross-section view of a ceramic laminate body according to a preferred embodiment of the present invention.

FIG. 1 is a cross-sectional view illustrating a ceramic laminate body of a chip capacitor, cut in a direction in which the ceramic layers are stacked, according to the first preferred embodiment of the present invention. A ceramic laminate body 1 includes a dielectric layer 11 and a plurality of internal electrodes 12a and 12b stacked along the dielectric layer 11.

Figure 2:
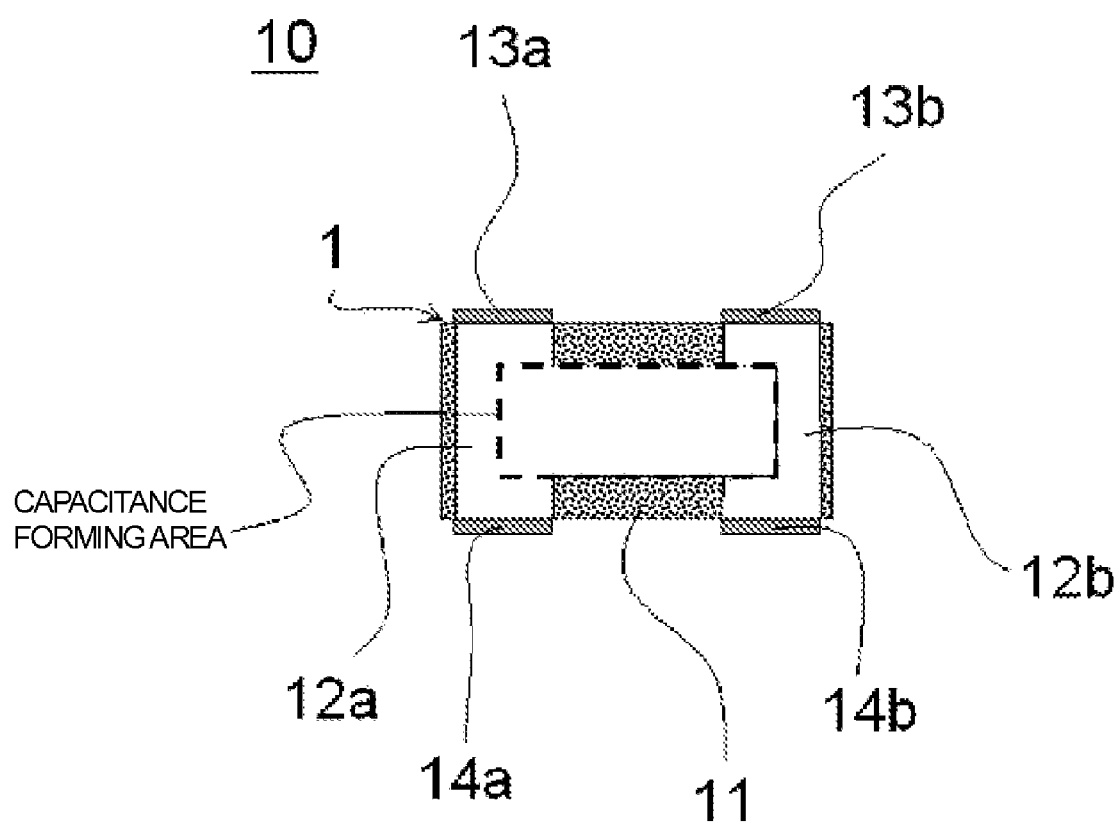
FIG. 2 is a cross-section view of a chip capacitor according to a preferred embodiment of the present invention.

FIG. 2 is a cross-sectional view illustrating a chip capacitor, cut in a direction in which the ceramic layers are stacked, according to the first preferred embodiment of the present invention. A chip capacitor 10 includes the ceramic laminate body 1 and a plurality of terminal electrodes 13a, 13b, 14a, and 14b arranged to electrically connect the plurality of internal electrodes. The internal electrode 12a faces the internal electrode 12b with the dielectric layer 11 therebetween. The area of the internal electrode 12a that overlaps with the internal electrode 12b (the area indicated by a dotted line) provides electrostatic capacitance.

Figure 3:
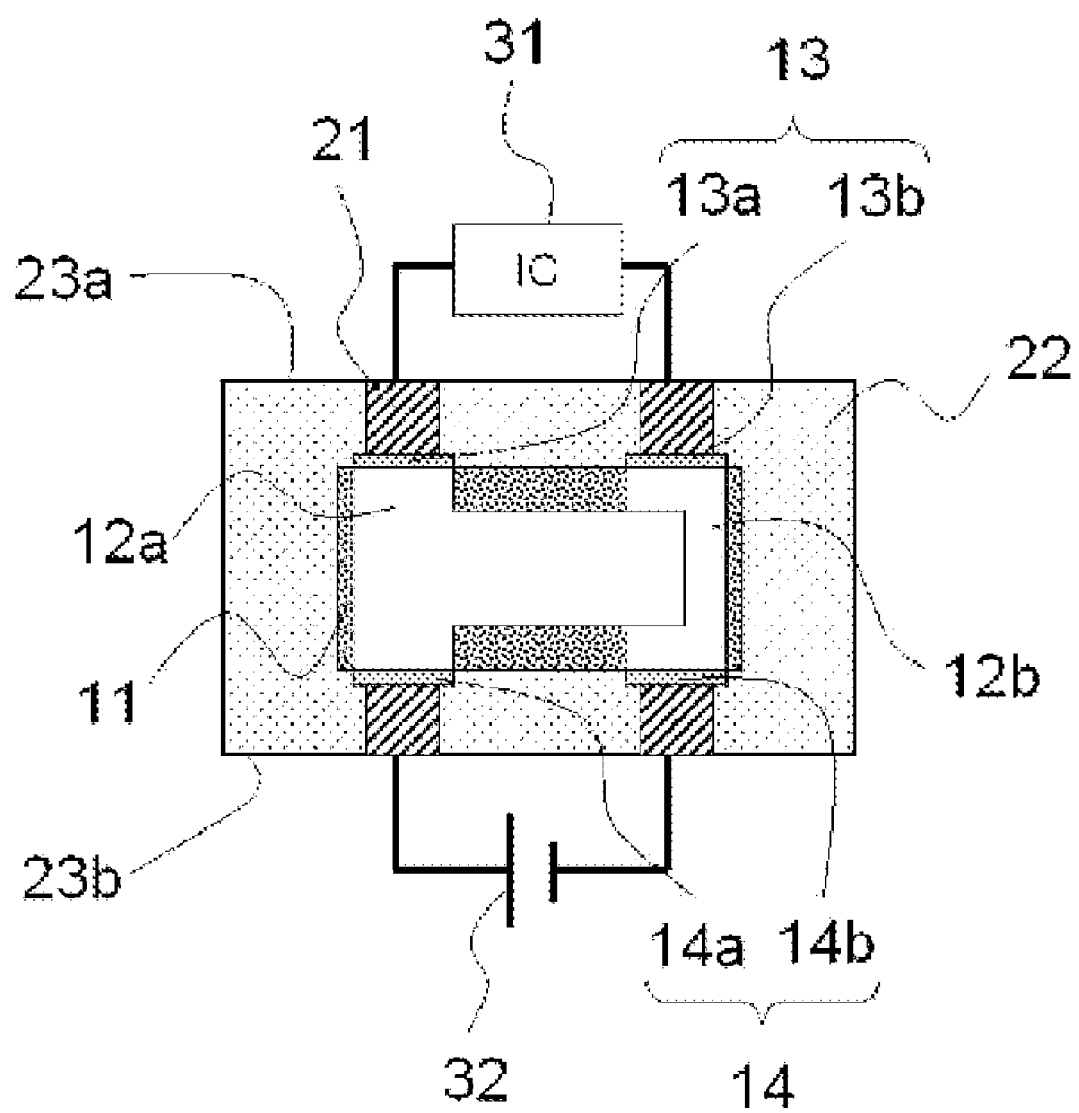
FIG. 3 is a cross-section view of a component-embedded substrate including a chip capacitor and illustrates an electrical connection of the component-embedded substrate.

FIG. 3 is a cross-sectional view illustrating a component-embedded substrate according to the first preferred embodiment of the present invention. The chip capacitor is embedded in the component-embedded substrate. The chip capacitor is surrounded by a resin 22. The component-embedded substrate has a first principal surface 23a and a second principal surface 23b. The plurality of terminal electrodes define a first terminal electrode group 13 connected to the first principal surface 23a and a second terminal electrode group 14 connected to the second principal surface 23b. The first terminal electrode group 13 includes the terminal electrodes 13a and 13b. The second terminal electrode group 14 includes the terminal electrodes 14a and 14b.

According to the present preferred embodiment, the terminal electrode 13a of the first terminal electrode group 13 is electrically connected to the terminal electrode 14a of the second terminal electrode group 14 via the internal electrode 12a. Capacitance is provided between the terminal electrodes 13a and 13b of the first terminal electrode group 13 via the dielectric layer 11. In addition, capacitance is provided between the terminal electrodes 14a and 14b of the second terminal electrode group 14 via the dielectric layer 11. The direction in which the internal electrodes 12a and 12b are stacked is parallel or substantially parallel to the principal surfaces 23a and 23b of the component-embedded substrate. Furthermore, the terminal electrodes 13a and 13b are preferably electrically connected to an active component 31 through via holes 21, for example. The terminal electrodes 14a and 14b are preferably electrically connected to a power supply 32 through the via holes 21, for example. Examples of the active component 31 include an integrated circuit (IC) and a large-scale integration (LSI).

In the configuration according to the present preferred embodiment, capacitors are connected in parallel in a current path from the power supply 32 to the active component 31. In addition, a capacitance forming area of the capacitor is provided in the current path of the internal electrodes. In this manner, a high-frequency noise current negligibly flows from the power supply 32 to the active component 31. Thus, the high-frequency noise current is easily removed by the capacitors. At that time, for example, since the current flows from the terminal electrode 14a to the terminal electrode 14b via the internal electrode 12a and the internal electrode 12b, the inductance is decreased. As a result, the impedance in a high-frequency range is decreased, and therefore, the high-frequency noise absorption performance can be significantly improved.

In addition, since the high-frequency current to be input from the power supply 32 to the active component 31 flows across the shortest distance via the internal electrodes, the inductance component and the resistance component of the current path can be significantly reduced. Accordingly, the output impedance characteristic with respect to an active component of the decoupling circuit is improved in a high-frequency range. As a result, high-frequency responsiveness to the active component is improved.

Second Preferred Embodiment

Figure 4:
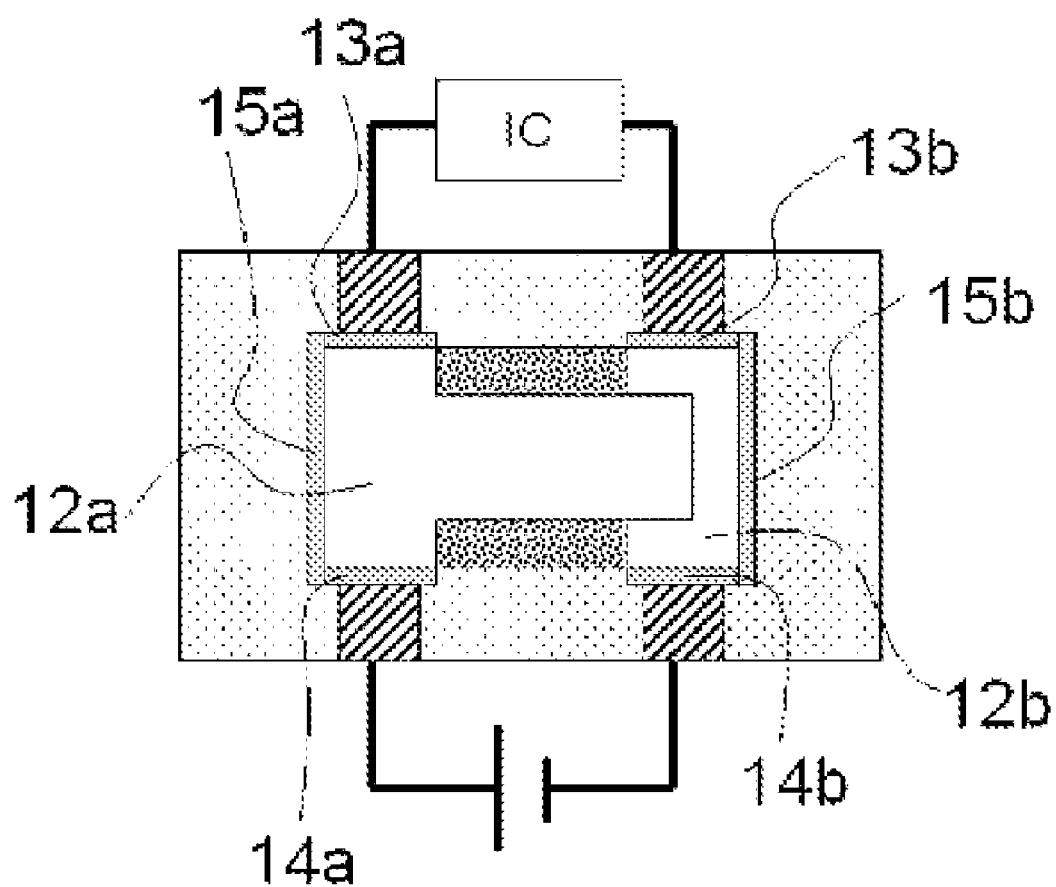
FIG. 4 is a cross-section view of a component-embedded substrate including a chip capacitor and illustrates an electrical connection of the component-embedded substrate.

FIG. 4 is a cross-sectional view of a component-embedded substrate according to a second preferred embodiment of the present invention. Descriptions of components similar to those of the first preferred embodiment are not repeated.

The internal electrode structure of the capacitors shown in FIG. 4 is similar to that of the first preferred embodiment. However, the terminal electrode 13a and the terminal electrode 14a are electrically connected with each other via a connection electrode 15a provided on the outer surface of the ceramic laminate body in addition to via the internal electrode 12a. Similarly, the terminal electrode 13b is additionally connected to the terminal electrode 14b via a connection electrode 15b. Note that the terminal electrode may preferably be integrated into the connection electrode.

With such a configuration, the second preferred embodiment can provide substantially the same advantages as that of the first preferred embodiment. In addition, since the current flows in the connection electrode, the number of current paths is increased. Accordingly, the value of a direct current resistance component between the power supply 32 and the active component 31 can be advantageously decreased. As a result, voltage drop and heat generation occurring when a direct current flows from the power supply 32 to the active component 31 is reduced.

On the other hand, the high-frequency noise current tends to flow across the shortest distance in which the inductance component is minimized. Accordingly, a negligible high-frequency noise current flows in a connection electrode portion provided on the end surface of the chip. As a result, the high-frequency noise absorption performance is negligibly degraded.

In addition, according to the present preferred embodiment, the directions of two currents flowing through adjacent terminal electrodes in the first terminal group are preferably reversed. For example, the direction of a current flowing from the terminal electrode 14a to the terminal electrode 13a via the internal electrode 12a is preferably reversed as compared to the direction of a current flowing from the terminal electrode 13b to the terminal electrode 14b via the internal electrode 12b. Such a configuration cancels out magnetic fields generated by the currents. Accordingly, the inductance is decreased, and therefore, the high-frequency noise absorption performance and high-frequency responsiveness of the active component can be further improved.

Third Preferred Embodiment

Figure 5:
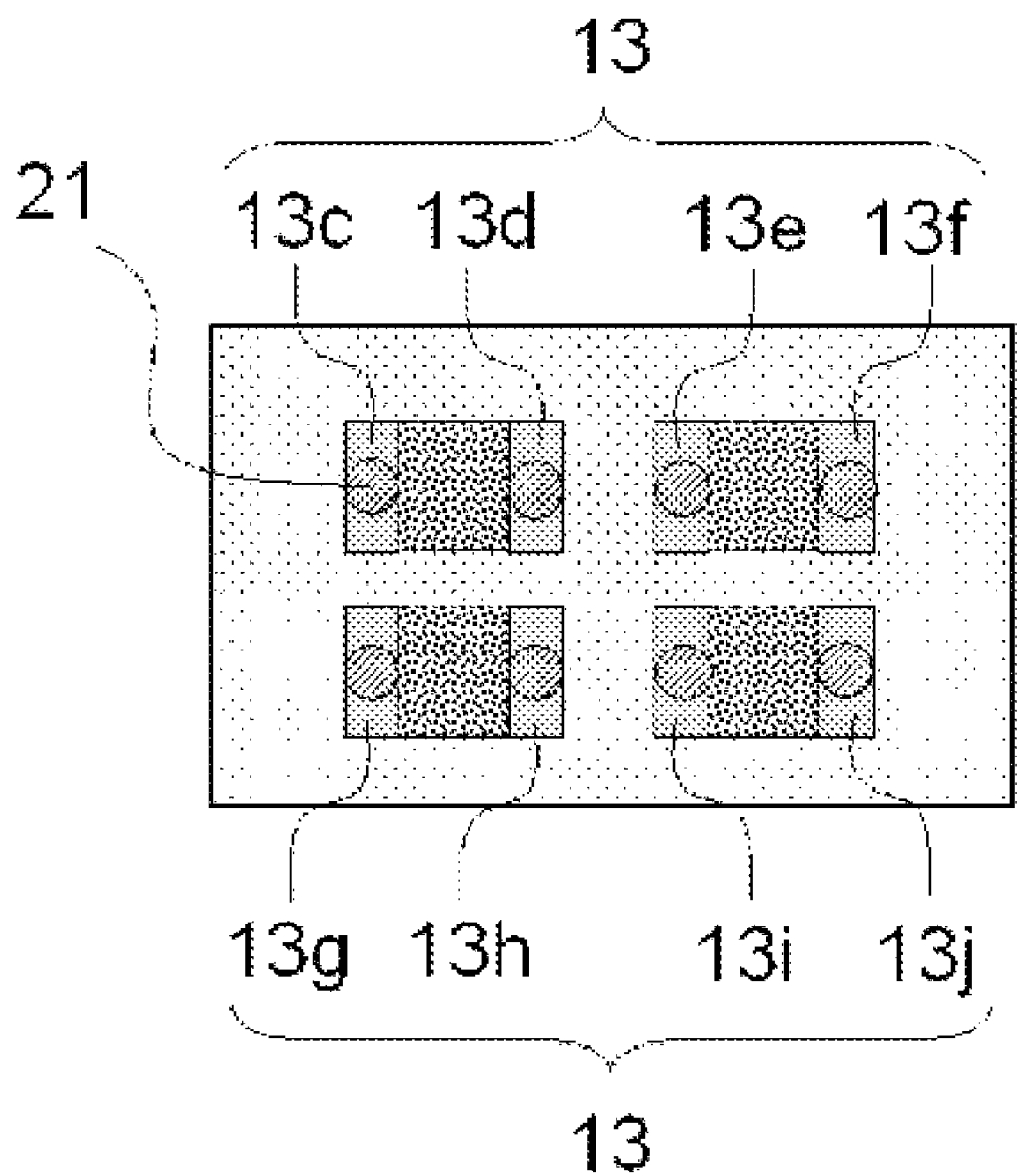
FIG. 5 is a top view of a component-embedded substrate including a plurality of chip capacitors.

FIG. 5 is a layout diagram of chip capacitors provided in a component-embedded substrate according to a third preferred embodiment of the present invention. More specifically, FIG. 5 is a top view of chip capacitors provided in a component-embedded substrate when a resin disposed on the chip capacitors is removed. For example, via holes 21 are connected to the terminal electrodes.

The component-embedded substrate includes a plurality of chip capacitors. In the present preferred embodiment, four chip capacitors are preferably included, for example. A first terminal electrode group 13 including terminal electrodes 13c, 13d, 13e, 13f, 13g, 13h, 13i, and 13j is arranged across the plurality of chip capacitors.

Such a configuration including a plurality of chip capacitors disposed therein provides substantially the same advantages as that of the first and second preferred embodiments. In addition, the configuration can preferably increase the noise absorption performance. Furthermore, since magnetic fields generated by currents are canceled out, the inductance is decreased. Therefore, the high-frequency noise absorption performance and the responsiveness of the high-frequency active component can be further improved.

Fourth Preferred Embodiment

Figure 6:
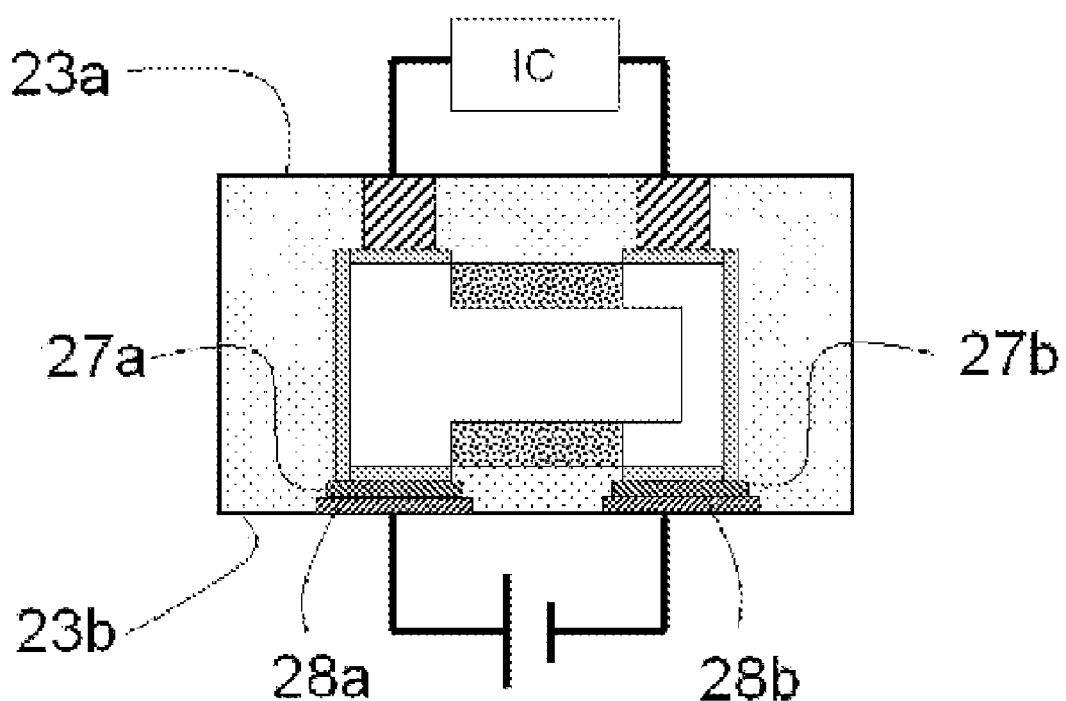
FIG. 6 is a cross-section view of a component-embedded substrate including a chip capacitor and illustrates an electrical connection of the component-embedded substrate.

FIG. 6 is a cross-sectional view of a component-embedded substrate incorporating a chip capacitor according to a fourth preferred embodiment of the present invention.

According to the present preferred embodiment, terminal electrodes of a chip capacitor are electrically connected to conductive lands 28a and 28b provided on the second principal surface 23b of the component-embedded substrate via conductive adhesive agents (or solder) 27a and 27b, respectively. In addition, the conductive lands 28a and 28b are exposed on the second principal surface 23b of the component-embedded substrate.

Such a configuration eliminates the need for a via hole disposed on the side of at least one of the principle surfaces of the component-embedded substrate. Accordingly, the inductance occurring between the terminal electrode of the chip capacitor and the surface of the substrate can be further decreased. In addition, the thickness of the substrate can preferably be reduced. Furthermore, since pass/fail inspection as to whether the quality of the component-embedded substrate satisfies a predetermined condition can be performed before active components and a power supply are connected to the substrate, the manufacturing cost can be reduced and the manufacturing yield of the component-embedded substrate can be increased.

Furthermore, according to the present preferred embodiment, the terminal electrodes of the chip capacitor preferably have surfaces made of copper, for example. In order to electrically connect an active component to the capacitor in the component-embedded substrate, the hole for the via hole is preferably formed using a $CO_2$ laser, for example. In such a case, a resin arranged from the surface of the component-embedded substrate to the terminal electrode must be processed. The absorption ratio of copper for the wavelength of the $CO_2$ laser is relatively low. Accordingly, if the surface of the terminal electrode is made of copper, melting of the surface caused by the $CO_2$ laser is minimized as compared to other electrode materials. Thus, the terminal electrodes can be easily and efficiently processed. For this same reason, if the conductive lands are made of copper, the conductive lands can be easily processed by laser radiation.

COMPARATIVE EXAMPLE 1

Figure 7:
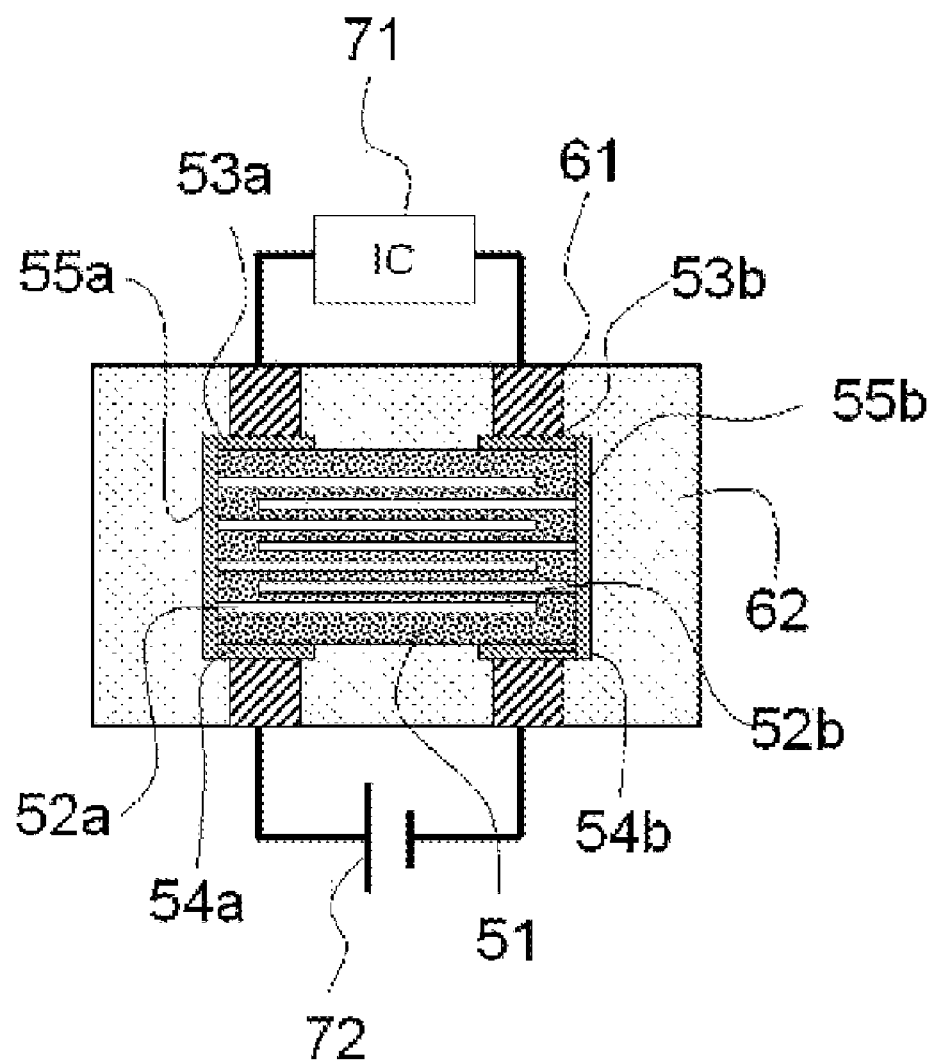
FIG. 7 is a cross-section view of a component-embedded substrate including a chip capacitor and illustrates an electrical connection of the component-embedded substrate according to a comparative example.

FIG. 7 is a cross-sectional view of an existing component-embedded substrate including a general-purpose capacitor. The direction in which internal electrodes of the capacitor are stacked is perpendicular to the principal surfaces of the component-embedded substrate. A terminal electrode 53a is electrically connected to a terminal 54a via a connection electrode 55a.

COMPARATIVE EXAMPLE 2

Figure 8:
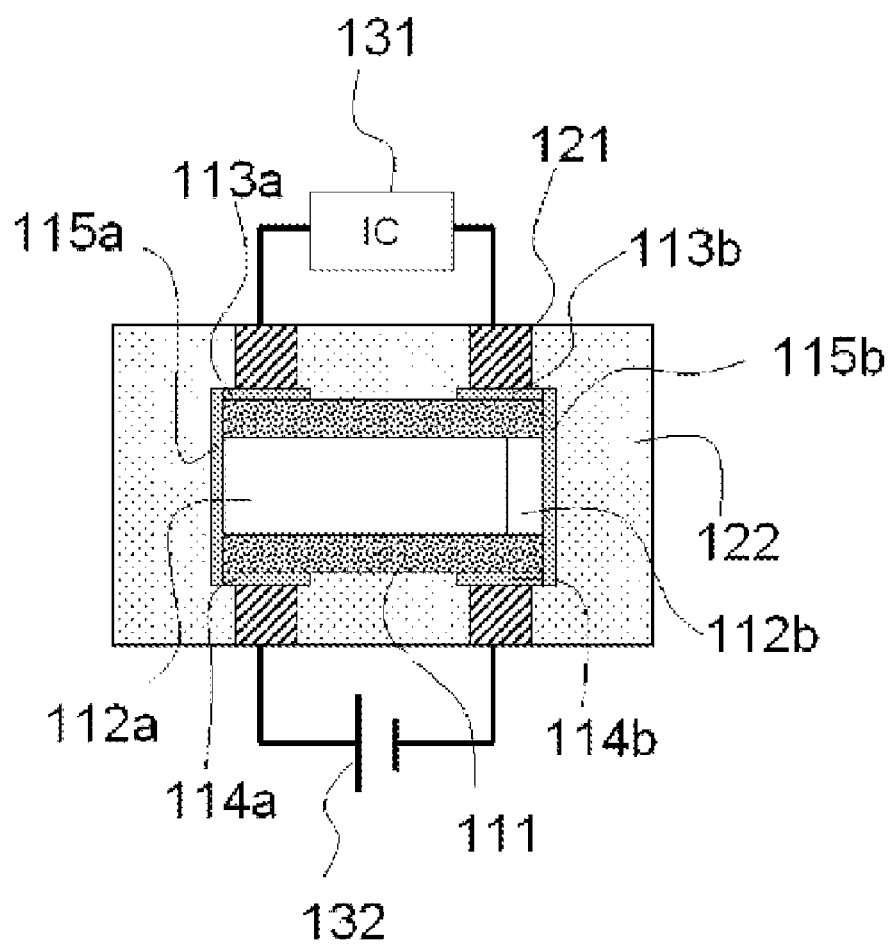
FIG. 8 is a cross-section view of a component-embedded substrate including a chip capacitor and illustrates an electrical connection of the component-embedded substrate according to a comparative example.

FIG. 8 is a cross-sectional view of an existing component-embedded substrate including a general-purpose capacitor. A capacitor similar to that of comparative example 1 is used for comparative example 2. However, unlike comparative example 1, the direction in which internal electrodes of the capacitor are stacked is parallel to the principal surfaces of the component-embedded substrate. A terminal electrode 113a is electrically connected to a terminal electrode 114a via a connection electrode 115a. The terminal electrode 113a is not directly connected to the terminal electrode 114a via an internal electrode 112a.

Figure 9:
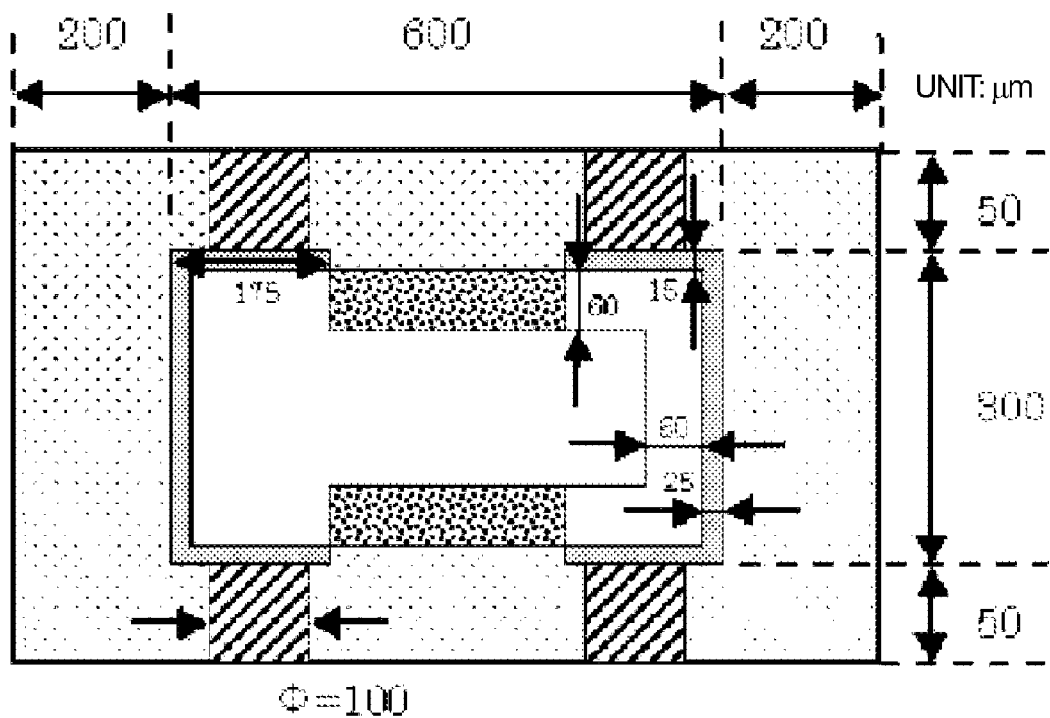
FIG. 9 illustrates dimensions of components of a model including the components embedded therein.

The frequency characteristic of the second preferred embodiment was compared to the frequency characteristic of each of comparative examples 1 and 2 using an electromagnetic field analysis simulation. The absolute values of the attenuation characteristic (S21) of the input/output voltage and the output impedance (Z22) for an active component are computed first and, subsequently, the frequency characteristics of the second preferred embodiment was compared to the frequency characteristic of each of comparative examples 1 and 2. The dimensions of components of the second preferred embodiment are shown in FIG. 9. The specifications of the materials are shown in Table 1.

In the simulation, a chip capacitor having a size of about 600 μm (length)×about 300 μm (width)×about 300 μm (thickness) was used. Six layers of internal electrodes and six dielectric layers were alternately stacked, and a configuration including a total of 12 layers was formed. The thickness of the dielectric layer was about 2 μm. The thickness of the internal electrode was about 2 μm. Each of the outermost dielectric layers had a thickness of about 50 μm.

The chip capacitor in each of comparative examples 1 and 2 includes the internal electrode having a size of about 490 μm×about 150 μm×about 2 μm. The shapes of components other than the internal electrode are substantially the same as those of the second preferred embodiment. In comparative example 1, the direction in which the internal electrodes are stacked is perpendicular to the two principal surfaces of the component-embedded substrate. However, in comparative example 2, the direction in which the internal electrodes are stacked is parallel to the two principal surfaces of the component-embedded substrate.

TABLE 1

| Component | Material | Relative Permittivity ε | Relative Magnetic Permeability μ | Electrical Conductivity σ [S/m] |
|---|---|---|---|---|
| Internal Electrode | Ni | 1 | 600 | $1.5 \times 10^7$ |
| Terminal Electrode/ Connection Electrode | Cu | 1 | 1 | $5.8 \times 10^7$ |
| Via Hole | Cu | 1 | 1 | — |
| Dielectric Layer | Ceramic | 3000 | 1 | — |
| Resin | Resin | 4 | 1 | — |

Figure 10:
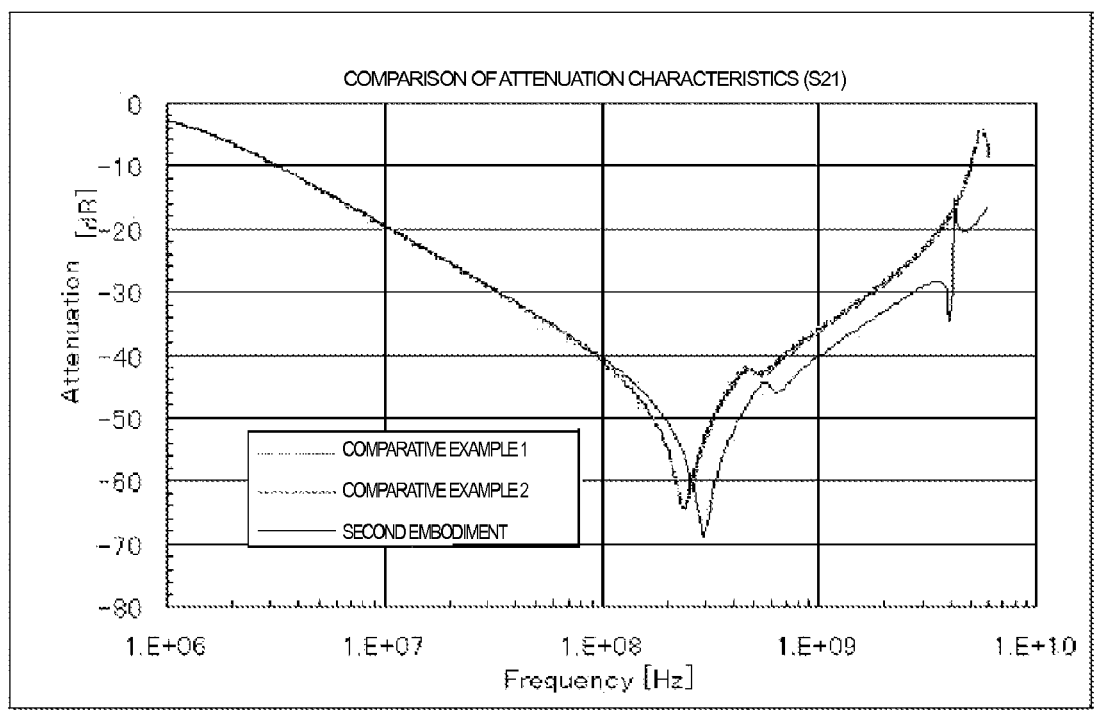
FIG. 10 illustrates a relationship between the frequency and the attenuation characteristic according to simulation.

FIG. 10 illustrates a relationship between the frequency and the attenuation characteristic of a voltage according to the simulation. As shown in FIG. 10, the attenuation characteristics of comparative examples 1 and 2 have substantially the same curve. In contrast, comparison between each of comparative examples 1 and 2 and the second preferred embodiment indicates that the attenuation characteristic of the second preferred embodiment is improved by about 4 dB at a frequency of about 1 GHz. Thus, the second preferred embodiment has an outstanding noise absorption performance.

Figure 11:
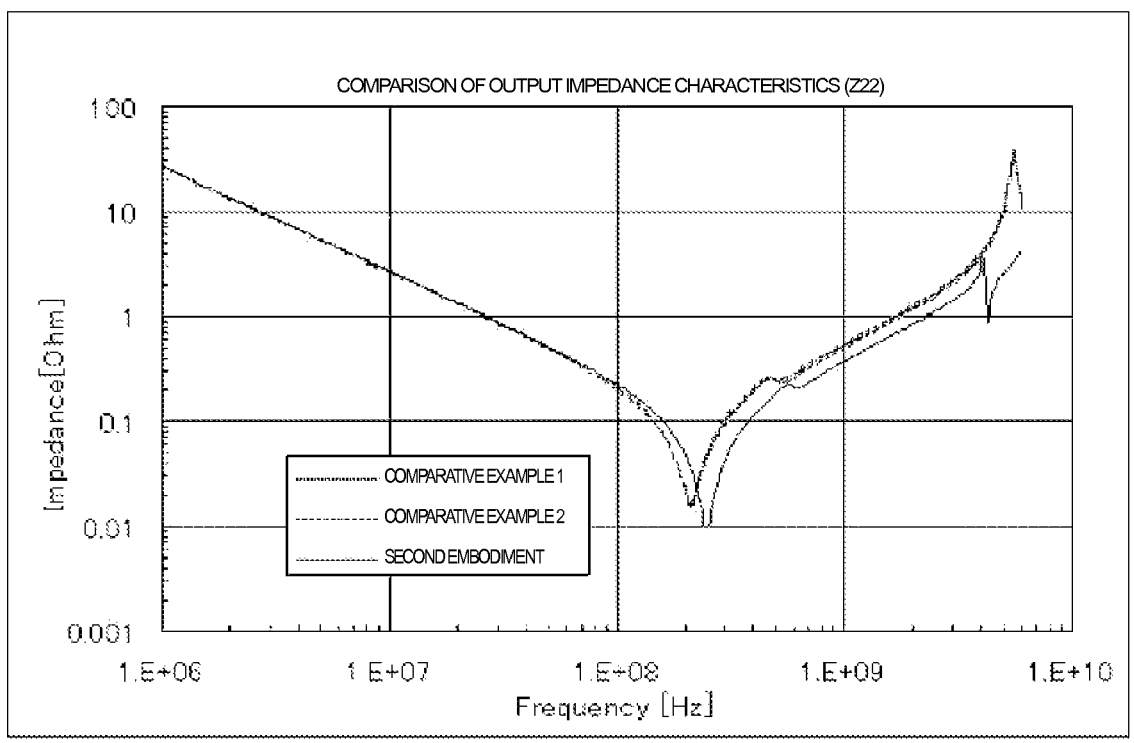
FIG. 11 illustrates a relationship between the frequency and the output impedance according to simulation.

FIG. 11 illustrates a relationship between the frequency and the output impedance according to the simulation. As shown in FIG. 11, the output impedances of comparative examples 1 and 2 have substantially the same curve. In contrast, comparison between each of comparative examples 1 and 2 and the second preferred embodiment indicates that the output impedance of the second preferred embodiment is decreased by about 25% at a frequency of about 1 GHz.

According to the preferred embodiments of the present invention, the inductance component of the chip capacitor can be reduced, and therefore, the high-frequency responsiveness of the active component and the high-frequency noise absorption performance can be improved. In addition, it follows that the number of decoupling capacitors required for the circuit can be reduced.

It should be understood that the above-described preferred embodiments are only illustrative. Various modifications can be made without departing the scope and spirit of the present invention. For example, while the foregoing preferred embodiments have been described with reference to the component-embedded substrate having an upper principal surface connected to the active components and a lower principal surface connected to the power supply, the component-embedded substrate having a lower principal surface connected to the active components and an upper principal surface connected to the power supply. In addition, while the foregoing preferred embodiments have been described with reference to the substantially T-shaped internal electrodes, the internal electrodes may have any suitable shape. In addition, the dimensions of the internal electrodes may be freely changed. Furthermore, when the substrate includes a plurality of chip capacitors, the specifications of the chip capacitors need not be the same. For example, chip capacitors having different shapes and specifications, such as different sizes, capacitances, and temperature characteristics, for example, may be embedded in a substrate. Still furthermore, it is desirable that the size of the included chip capacitor is smaller than the pitch of terminal electrodes of incorporated active components. However, by changing a method for including the chip capacitors, a chip capacitor larger than the pitch of terminal electrodes can be employed.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A component-embedded substrate comprising:
    a chip capacitor included in the component-embedded substrate, the chip capacitor including a ceramic laminate body and a plurality of terminal electrodes, the ceramic laminate body including a dielectric layer and a plurality of internal electrodes stacked along the dielectric layer, the plurality of terminal electrodes being arranged to connect the internal electrodes with one another; and
    first and second principal surfaces; wherein
    at least two of the plurality of terminal electrodes are connected to the first principal surface and define a first terminal electrode group;
    at least two of the plurality of terminal electrodes are connected to the second principal surface and define a second terminal electrode group;
    at least one terminal electrode in the first terminal electrode group is electrically connected to at least one terminal electrode in the second terminal electrode group via at least one of the internal electrodes;
    capacitance is provided by at least one pair of the terminal electrodes in the first terminal electrode group via the dielectric layer, and capacitance is provided by at least one pair of the terminal electrodes in the second terminal electrode group via the dielectric layer; and
    a direction in which the internal electrodes are stacked is parallel or substantially parallel to the first and second principal surfaces of the component-embedded substrate.

2. The component-embedded substrate according to claim 1, wherein the at least one terminal electrode in the first terminal electrode group that is electrically connected to the at least one terminal electrode in the second terminal electrode group via the internal electrode are additionally connected via a connection electrode provided on an outer surface of the ceramic laminate body.

3. The component-embedded substrate according to claim 1, wherein directions of electric currents flowing from one terminal electrode to the closest adjacent terminal electrode in the first terminal electrode group are reversed.

4. The component-embedded substrate according to claim 1, wherein the chip capacitor includes a plurality of chip capacitors, and one of the first terminal electrode group and the second terminal electrode group is arranged across the plurality of the chip capacitors.

5. The component-embedded substrate according to claim 1, wherein the terminal electrode of the chip capacitor is electrically connected to a conductor land provided on one of the first and second principal surfaces, and the conductor land is exposed on a surface of the component-embedded substrate.

6. The component-embedded substrate according to claim 5, wherein the terminal electrode of the chip capacitor has a surface made of copper.

7. The component-embedded substrate according to claim 5, wherein the conductor land is made of copper.

8. A component package comprising:
    the component-embedded substrate according to claim 1;
    an active component electrically connected to one of the first and second principal surfaces of the component-embedded substrate; and
    a power supply electrically connected to the other one of the first and second principal surfaces of the component-embedded substrate.

* * * * *